United States Patent [19]

Harding

[11] Patent Number: 4,831,495

[45] Date of Patent: May 16, 1989

[54] UNITIZED PACKAGING ARRANGEMENT FOR AN ENERGY DISSIPATING DEVICE

[76] Inventor: Ade'yemi S. K. Harding, 12513 Hunters Chase Dr., Austin, Tex. 78729

[21] Appl. No.: 75,722

[22] Filed: Jul. 20, 1987

[51] Int. Cl.$^4$ .............................................. H05K 7/20
[52] U.S. Cl. .................................... 361/386; 29/825; 29/174; 174/52.4
[58] Field of Search ............... 174/52 R, 52 PE, 52 S, 174/52 FP, 52 H, 52 P; 29/825, 829, 830, 831, 848, 853; 361/386

[56] References Cited

U.S. PATENT DOCUMENTS

| | | | |
|---|---|---|---|
| 3,585,455 | 6/1971 | Naylor | 333/84 X |
| 4,004,195 | 1/1977 | Harayda et al. | 174/52 FP |
| 4,235,285 | 11/1980 | Johnson et al. | |
| 4,524,238 | 6/1985 | Butt | 174/52 FP |
| 4,618,739 | 10/1986 | Theobald | 174/52 FP |
| 4,621,304 | 11/1986 | Oogaki et al. | 361/386 |
| 4,629,824 | 12/1986 | Gilder, Jr. et al. | 174/52 FP |
| 4,692,561 | 9/1987 | Nattel | 174/65 SS |
| 4,701,999 | 10/1987 | Palmer | 437/211 |
| 4,715,115 | 12/1987 | King et al. | 29/841 |

OTHER PUBLICATIONS

Note: The Documents AG and AH are cited in PTO 1449 of Mar. 15, 1988.

Primary Examiner—A. D. Pellinen
Assistant Examiner—Morris Gimsburg
Attorney, Agent, or Firm—Barnes & Thornburg

[57] ABSTRACT

A unitized packaging arrangement for an energy dissipating device comprises a thermoplastic housing, base, and cap which are joined together to form the package for the device. The thermoplastic housing is formed to mountably receive the energy dissipating device and is provided with a metallized conductor pattern on portions of its outer surface. The conductor pattern is connected to a plurality of bonding pads on the device. In a preferred embodiment, the conductor pattern includes the metallized surface of at least one opening formed in the thermoplastic housing. In an especially preferred embodiment, a conductive element (such as a conductive pin) is located in the opening and is joined to the metallized surface by soldering. The thermoplastic base is formed to mountably receive the thermoplastic housing following mounting of the device, and provides access to the conductor pattern from outside the packaging arrangement. In a preferred embodiment, at least portions of the interior surfaces of the base and cap, and matching portions of the exterior surfaces of the thermoplastic housing, are metallized and pre-tinned with solder. The housing, base and cap are then joined by a metal-to-metal bonding technique, such as reflow soldering. In addition to providing a mechanism for mechanically bonding the components of the packaging arrangement together, the metallized surfaces provide barriers to the ingress of moisture to the area surrounding the device, and provide a mechanism for regulating the flow of heat from the device.

18 Claims, 1 Drawing Sheet

UNITIZED PACKAGING ARRANGEMENT FOR AN ENERGY DISSIPATING DEVICE

BACKGROUND AND SUMMARY OF THE INVENTION

This invention relates generally to a packaging arrangement for an energy dissipating device, such as an electronic component, and more specifically to a unitized packaging arrangement which utilizes preformed thermoplastic components.

Traditional packaging arrangements for electronic components include dual in-line packages (DIP's), single in-line packages (SIP's), small outlines (SO's) and the leaded chip carrier family. These traditional packaging arrangements are based on the use of metallic leadframes having plurality of leads which are interconnected on one end to the bonding pads of the device and which extend through the package to provide a means for connecting the device to external components. Maintaining an adequate seal between the leads of the leadframe and the packaging material used to encapsulate the leads and the device has been a source of concern in the electronics packaging industry. These concerns are discussed in my co-pending patent application entitled "Packaging Arrangement For Energy Dissipating Devices" filed on Jan. 20, 1987, and assigned Ser. No. 004,70, and a continuation in-part of that application, entitled "Preformed Packaging Arrangement for Energy Dissipating Devices," filed concurrently with the present application and assigned Ser. No. 75,642. To the extent necessary to further the understanding of the present invention, the disclosures of those applications are hereby incorporated into the present application by reference thereto.

An alternative approach to the above-mentioned packaging arrangements is the pin grid array (PGA) family of packages in which a plurality of conductor pins are arranged in an array rather than in single or double lines, squires or other configurations. The pins extend through the enclosure surrounding the device, and are normally intended to extend through holes in a printed circuit board or otherwise mate with known forms of interconnecting devices. For the most part, the PGA packaging format is not readily compatible with the emerging trend toward the use of surface mounted components on printed circuit board assemblies.

An object of the present invention is to provide a unified approach to the design of packaging arrangements for electronic devices, which arrangements are compatible or interchangeable with known arrangements, such as DIP's, SIP's, QUAD's and PGA's.

Another object of the present invention is to provide a packaging arrangement for an energy dissipating device which is especially well suited for the surface mounting of devices on printed circuit boards.

Yet another object of the present invention is to provide a packaging arrangement for an energy dissipating device which utilizes injection molding and metallization techniques in its construction.

A still further object of the present invention is to provide a packaging arrangement for an energy dissipating device which provides optimal protection for the device against the ingress of moisture into the packaging arrangement.

Yet still another object of the present invention is to provide a packaging arrangement for an energy dissipating device which may be readily and efficiently assembled by automated techniques.

These and other objects of the invention are attained in a packaging arrangement which includes a thermoplastic housing which is especially formed to mountably receive an energy dissipating device, and which is provided with a pattern of electrical conductors deposited on an outer surface thereof. The conductor pattern is connected to the bonding pads of the device. A preformed thermoplastic base is formed to mountably receive the thermoplastic housing and is provided with means (such as a plurality of openings) for providing access to the electrically conductive pattern from outside the packaging arrangement. The arrangement further comprises a preformed thermoplastic cap, and means for joining the thermoplastic housing, the thermoplastic base, and the thermoplastic cap to form the unitized packaging arrangement for the device. The electrically conductive pattern preferably includes a plurality of openings formed in the thermoplastic housing. At least a portion of the surface of the openings is preferably metallized. In an especially preferred embodiment, conductive elements, in the form of conductive pins, are located within the openings. The conductive elements are preferably joined to the metallized surface of the openings by a reflow soldering technique.

In the preferred embodiment of the packaging arrangement of the present invention, at least a portion of the interior surfaces of the preformed thermoplastic base and cap, and a matching portion of the exterior surface of the thermoplastic housing, are also metallized. The metallized areas are pre-tinned prior to assembly of the base, housing and cap, so that these elements may be mechanically joined together by reflow soldering. In addition to providing the mechanical means for holding these elements together, the metallized layers provide a barrier against the ingress of moisture into the interior of the packaging arrangement where the device is located. For this reason, the metallization preferably extends to substantially all of the interior surfaces of the base and cap, and exterior surfaces of the thermoplastic housing. This arrangement further provides a degree of electromagnetic shielding of the device and, thus, decreases electromagnetic interference and possibly increases the radiation hardness of the device.

In the preferred embodiment of the invention, special care is taken to electrically isolate the electrically conductive elements which are connected to the bonding pads of the device from the metallized interior and exterior surfaces of the base, cap and housing. These metallized surfaces may, however, be intentionally placed in thermal communication with the device in order to regulate heat transport from the device.

The preferred method of constructing the packaging arrangement of the present invention includes the steps of: forming the thermoplastic housing; depositing conductor means on a surface of the housing; mounting the energy dissipating device in the housing; connecting the bonding pads of the device to the conductor means; forming a thermoplastic cap and base; and joining the thermoplastic housing, base, and cap to form a unitized packaging arrangement for the device. An especially preferred method of the present invention further includes the additional steps of: metallizing at least a portion of an exterior surface of the thermoplastic housing; metallizing at least a portion of respective interior surfaces of the thermoplastic cap and base; and joining the thermoplastic housing, base and cap by a metal-to-metal bonding technique, such as soldering.

Other objects, advantages and novel features of the present invention will become apparent from the following detailed description of the invention when considered in conjunction with the accompanying drawings.

DETAILED DESCRIPTION OF THE DRAWINGS

Figure 1:
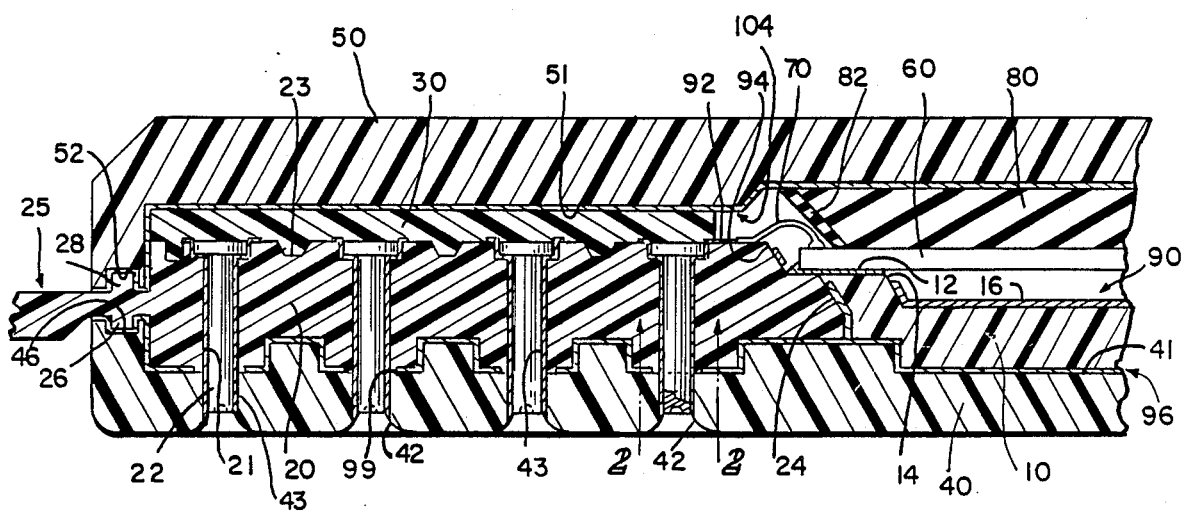
FIG. 1 shows a cross-sectional view through a representative portion of a packaging arrangement constructed in accordance with the present invention.

FIG. 1 shows a cross-sectional view of a packaging arrangement according to the present invention. The packaging arrangement illustrated in FIG. 1 is configured as a pin grid array arrangement, although it is readily apparent that the package could be configured in the QUAD format by changing the pin layout to provide a single column of pins on each of four sides of the package. Similarly, SIP, DIP and SO arrangements can be configured by placing the conductive pins 22 in single or dual column.

The basic components of the packaging arrangement include a molded thermoplastic housing which, in this preferred embodiment, is made up of elements 10, 20 and 30, a molded thermoplastic base 40 and a molded thermoplastic cap 50. As noted below, the term "housing" in this application refers to an internal (to the completed packaging arrangement) frame which is presented in the assembly process for mounting of the energy dissipating device, which may, for example, be a semiconductor device, prior to final encasement. In the preferred embodiment shown in FIG. 1, this frame or housing is formed of three elements (10, 20 and 30). Alternative embodiments are possible and would be considered to fall within the scope of the present invention.

Thermoplastic housing element 10 is injection-molded from a thermoplastic material, and is metallized with a low thermal conductivity metal on substantially all of its external surface, except in the area generally designated by reference numeral 12 where energy dissipating device 60 is bonded to element 10. In this area, a relatively high thermal conductivity metal is used to metallize the external surface of element 10, and device 60 is bonded to element 10 (and to a portion of element 20) by suitable means, such as silver-filled epoxy. A gap 14 between region 12 and the relatively low thermal conductivity metal isolates device 60 from the low thermal conductivity layer, which otherwise substantially covers the remaining external surface area of insert element 10. This low thermal conductivity metal layer is typified by layer 16, which is shown in somewhat exaggerated thickness for purposes of illustration. The purposes served by these metallized surface layers include providing a means for joining the various components of the packaging arrangement together to form a unitized package, to provide a barrier to the entry and migration of moisture into the area immediately surrounding the device, and to provide a means for regulating the flow of heat from the energy dissipating device. In the embodiment shown in FIG. 1, thermoplastic housing element 10 is formed so as to provide an opening or cavity 90 directly beneath a portion of device 60. Cavity 90 is primarily intended to regulate the flow of heat from device 60, and may form an air gap, or may be filled with foam, metal, or other materials to allow for regulation and control of the transport of heat from the device as desired. Other features relating to the regulation of heat flow from device 60 will be described below.

Immediately adjacent thermoplastic element 10 is thermoplastic element 20, which is similarly an injection-molded component and which is provided with a plurality of holes or openings 21 into which are inserted electrically conductive pins 22 which may be used for establishing electrical contact with the bonding pads of device 60, via a circuit pattern formed by metal deposition techniques on the top surface of element 20 (as illustrated in the area identified by reference numeral 92). The cylindrical surfaces of openings 21 immediately adjacent conductive pins 22 are preferably metallized to provide protection against the ingress of moisture through these openings and to provide a means for retaining pins 22 in openings 21 (e.g., by soldering). The metal layer between the surface of openings 21 and pins 22 is identified in FIGS. 1 and 2 by reference numeral 43. The metallized openings 21 are in continuous electrical communication with the circuit pattern, thereby facilitating the ability to vary the electrical properties of each circuit independently. More specifically, the metallized surface of openings 21 are connected to the conductor pattern deposited on the top surface of element 20, and this metallized surface can be used, if desired, as the means by which the conductor pattern communicates electrically with other devices or circuits outside of the packaging arrangement. Alternative, solid or hollow pins may be located in the openings, depending upon the type of electrical connection desired. It is specifically noted that the impedance (i.e., the resistance, inductance and capacitance) of the connection can be affected by the use of solid, hollow or other types of conductive elements chosen for use in the openings. Thus, this arrangement gives the designer some control over this aspect of the overall design.

As noted, a metal conductor pattern is deposited by standard metal deposition techniques on the top surface of element 20 to interconnect pins 22 with respective conductor lines and with device 60, via standard wire bonding, tape automated bonding (TAB), or flip-chip techniques. In addition to the metallized conductor pattern on the top surface of element 20, the side and bottom surfaces of element 20 are also metallized to allow element 20 to be bonded to element 10, base 40 and cap 50, as will be discussed in more detail below, and for the purpose of providing barriers to the ingress of moisture into the package. The top surface of element 20 is also provided with molded recesses 23 which are provided to enhance the molded bond formed between elements 20 and 30 when element 30 is molded in place subsequent to deposition of the conductor pattern on the top surface of element 20. Elements 10 and 20 are joined together at their mating surfaces, indicated generally by reference numeral 24, by process which includes pre-tinning the adjacent metallized surfaces and heating the elements to bond them together by reflowing the solder in the mating joints. Elements 10, 20 and 30, when fully assembled and joined, form an internal package frame or housing which would be presented for device attachment and connection of the device, by a technique such as wire bonding, to the conductor pattern. It is possible to construct this frame or housing with a greater or lesser number of parts, or as a single unified element. Any of such variations would be considered to fall within the scope of the present invention.

Figure 2:
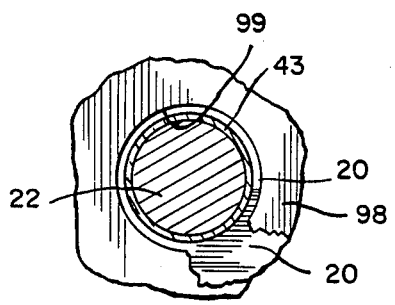
FIG. 2 shows a view taken along section line 2—2 of FIG. 1.

Premolded thermoplastic base 40 is formed with an upper surface 41 which mates with the lower surfaces of thermoplastic housing elements 10 and 20. A plurality of openings 42 are provided in base 40 to allow for passage of and access to the electrically conductive pins 22. Top surface 41 (the interior surface) of base 40 is completely metallized with a low thermal conductivity metal (102 in FIG. 3), except for a plurality of annular rings which are 15-20 thousandths of an inch in diameter, concentrically arranged around each of the openings 42. A matching pattern of concentric areas of non-metallized surface is provided on the lower surface of insert element 20. This is best illustrated in FIG. 2 which is a sectional view taken along section line 2—2 of FIG. 1, of the area immediately surrounding one of the conductor pins 22, showing a frontal view of the metallized bottom surface of housing element 20. Metallized layer 98 extends across the entire bottom surface of elements 10 and 20, except for annular areas 99 which form concentric rings around pins 22. These non-metallized areas on the facing surfaces of element 20 and base 40 provide for electrical isolation of each of the conductor pins from the metallized layers on these surfaces.

Base 40 is further provided with a locating recess 46 which mates with a tongue 26 of element 20. A similarly arranged recess 52 in cap 50 mates with opposite surface 28 of tongue 26. Tab 25 is part of the thermoplastic housing and, in its unbroken state, extends to an adjacent frame or housing and serves to hold together multiple housing elements for the initial assembly and mounting of the devices. If desired, testing can be performed on the multiple elements prior to and/or after the completion of the packaging process, before eventual separation of the packages into discreet units.

Cap 50 is a premolded thermoplastic cap which is fully metallized on its interior surface 51 with a relatively high thermal conductivity metal. Disposed in a central recessed area of cap 50 immediately adjacent device 60 is a thermally conductive elastomeric or silicone-based element 80, which forms intimate contact with the top surface of device 60, while not interfering with the adjacent bond wires 70. Elastomer 80 is preferably formed with a soft inner core and a relatively hard outer crust 82. Element 80 transfers heat from device 60 to the thermally conductive metallized layer on the interior surface 51 of cap 50. This feature of the present packaging arrangement is advantageous for the reasons discussed in my co-pending application Ser. No. 004,710 referred to above.

Final assembly of the complete package proceeds as follows: Premolded thermoplastic housing elements 10 and 20 are metallized on their exterior surfaces, as described above, and are pre-tinned and reflow soldered along their mating surfaces 24. The conductor pattern is then formed by metal deposition techniques on the top surface of element 20 to provide lead tip exposures for wire bonding purposes in the area generally designated by reference numeral 92, and to interconnect the metallized pin openings 21 in a manner consistent with the pin-out of device 60. Care must be taken to leave sufficient gaps, such as at 94, between the conductor pattern on the top surface of element 20 and the low thermal conductivity metal layer which covers most of the remaining exterior surfaces of element 20 to provide the requisite electrical isolation. The device bonding area is also metallized and suitably prepared for the selected device attachment material.

Depending upon the electrical requirements, solid or hollow pins are inserted into openings 21 and preferably soldered in position. Element 30 is now molded in place to complete the assembly of the thermoplastic housing. The exterior surfaces of element 30 are then metallized and these surfaces, along with the previously metallized exterior surfaces of elements 10 and 20, are pre-tinned for subsequent sealing to the cap and base. After mounting device 60 in the thermoplastic housing and establishing the connections between the device and the conductor pattern (e.g., by wire bonding), the assembly is ready for final sealing.

In the final sealing process, the thermoplastic housing with attached device is placed in base 40, and cap 50 is positioned over the housing. The package components are now clamped and heated to reflow the solder, attaching the cap and base to the housing. It should be noted that the metallized area of cap 50 which is designated by reference numeral 104 in FIG. 1 is not pre-tinned to avoid the possibility of solder dripping from this area onto the conductor pattern and bond wires and causing electrical shorts.

Figure 3:
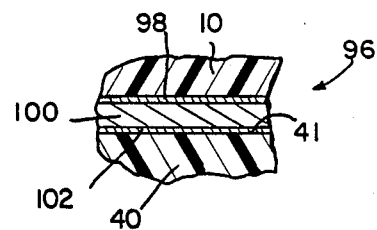
FIG. 3 shows an enlarged sectional view of the metal-to-metal bond formed between two of the preformed components of the packaging arrangement of the present invention.

FIG. 3 shows an enlarged view of area 96 which encompasses a portion of the bond formed between base 40 and housing element 10. Moving from top to bottom, the layers depicted in FIG. 3 are: thermoplastic housing element 10, low thermal conductivity metallized layer 98, solder bonding layer 100, low thermal conductivity metallized layer 102 (formed on interior surface 41 and base 40) and thermoplastic base 40. The structure of this bond is typical of the bonds existing between cap 50 and thermoplastic housing elements 20 and 30. It should be noted that, although reference is made in this particular embodiment to the use of metallized layers having relatively low thermal conductivities on portions of the housing elements and base, the use of a relatively high thermal conductivity layer is not precluded, when this will result in the improved transport of thermal energy in the overall arrangement.

Figure 4:
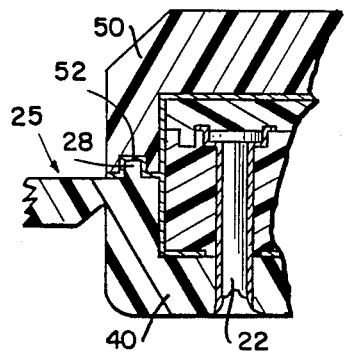
FIG. 4 shows an alternative embodiment of a portion of the packaging arrangement of FIG. 1.

FIG. 4 shows an alternative embodiment of a portion of the packaging arrangement of FIG. 1. In this embodiment, tab 25 is integrally formed with base 40. This eliminates the joint formed between recess 46 and tongue 26 and allows the vertical joint between housing elements 20 and 30, base 40 and cap 50, to extend uninterrupted along the full height of the housing elements. This provides an even greater degree of resistance to the ingress of moisture into the packaging arrangement.

The packaging arrangement of the present invention offers several advantages. First, mechanical stresses on the device due to temperature excursions or substantial temperature changes are minimized. Second, the moisture transport problem inherent in many plastic packaging forms is controlled by the metallized layers incorporated into the package. In addition, the absence of a metal lead frame eliminates the existence of plastic/metal interfaces which have historically presented problems in terms of maintaining an adequate seal. In the particular embodiment illustrated in the drawings, replacement of the traditional approach to plastic pin grid array packaging by a technique based upon use of thermoplastic injection molded components provides opportunities for improved seal arrangement and better mechanical integrity.

An additional advantage of the present invention involves the ability to modify the thermal energy transfer paths in the packaging arrangement. The transfer of energy from the top surface of the device for the wire bonded configuration depicted is effected by the thermally conducting elastomeric element 80 to the metallic thermal element (the metallized layer on interior surface 51) in cap 50. A similar arrangement would be used when tape automated bonding is employed. Where flip chip assembly is used, the back surface of the device would be placed in direct thermal contact with thermal element 80 in cap 50.

Use of a heat flow regulator, in the form of cavity 90, adjacent the device can be utilized as necessary and appropriate. Further design modifications to base 40 and cap 50, such as molded fins or extended surfaces, can be employed to further improve the thermal performance of the package. The use of other techniques, such as described in the above-referenced co-pending applications, is also possible.

Finally, the general applicability of the packaging arrangement to several different device types is an advantage. This feature facilitates the development of one package form based on the experience gained in the development of others. The device assembly processes similarly become common to all packaging forms. The absence of pins or leads eliminates major handling problems associated with present designs in device assembly, shipping and testing. A redesign of the shipping rails can now provide for testing and marking of the packages without singulation. Anti-static device protection during shipment can be maintained by an external clamp which forces the upper metallized or metal foil wrapped surface of the movable rail base to contact the pins of the package. In this way, a single voltage potential plane, in contact with ground potential, can be maintained on all pins. Lead trimming and forming operations are no longer required. Connection to the printed circuit board is accomplished by using a near spherical solder ball attachment technique between the package and the board. The spherical solder ball contacts a hemispherical indentation in the exposed ends of pins 22 (see FIG. 1). This technique reduces the number of solder joint failures occurring with present lead configurations used in the surface mounting of components on a circuit board. Even greater improvements in solder joint integrity are expected when premolded thermoplastic circuit boards gain wider acceptance. The hemispherical shape of the openings and pins of the packaging arrangement can be mirrored in the premolded thermoplastic boards to yield a spherical solder connection between package and board of similar material, resulting in a joint which will be superior to connections presently used.

From the preceding description of the preferred embodiments, it is evident that the objects of the invention are attained. Although the invention has been described and illustrated in detail, it is to be clearly understood that the same is to be taken by way of illustration and example only and is not to be taken by way of limitation. The spirit and scope of the invention are to be limited only by the terms of the appended claims.

What is claimed is:

1. A unitized packaging arrangement including an energy dissipating device, comprising:
   thermoplastic housing means having means for mountably receiving an energy dissipating device;
   conductor means, connected to a plurality of bonding pads on the device, for providing electrical access to the device;
   a thermoplastic base having means for mountably receiving the thermoplastic housing means, and having means, aligned with said conductor means, for providing access to said conductor means from outside the packaging arrangement; and
   a thermoplastic cap;
   wherein at least a portion of an exterior surface of the thermoplastic housing means, and at least portions of interior surfaces of the thermoplastic cap and base, are metallized, and wherein said housing means, base and cap are joined by a metal-to-metal bonding technique.

2. A packaging arrangement according to claim 1, wherein said conductor means comprises a conductor pattern deposited upon a generally horizontal surface of said thermoplastic housing means.

3. A packaging arrangement according to claim 2, wherein said conductor means further comprises an opening formed in said thermoplastic housing and an electrically conductive layer deposited upon at least a portion of a surface of said opening.

4. A packaging arrangement according to claim 3, wherein substantially all of the surface of said opening is metallized to prevent the ingress of moisture into the packaging arrangement.

5. A packaging arrangement according to claim 3, wherein said conductor means further comprises an electrically conductive element disposed within said opening in the thermoplastic housing means.

6. A packaging arrangement according to claim 5, wherein said electrically conductive element is soldered to the conductive layer on the surface of said opening.

7. A packaging arrangement according to claim 5, wherein said electrically conductive element is a solid pin disposed within said opening in the thermoplastic housing means.

8. A packaging arrangement according to claim 7, wherein said solid pin has hemispherical means on an exposed end thereof for connecting to mating connecting means external to said packaging arrangement.

9. A packaging arrangement according to claim 1, wherein the metallized interior surface of the cap has a relatively high thermal conductivity and is in thermal communication with the energy dissipating device.

10. A packaging arrangement according to claim 1, wherein a thermally conductive elastomer is disposed between the metallized interior surface of the cap and the energy dissipating device.

11. A packaging arrangement according to claim 1, wherein the metallized surfaces of the thermoplastic housing means and the base are in thermal communication with the energy dissipating device.

12. A packaging arrangement according to claim 1, wherein substantially all of the interior surface of the cap and base, and substantially all of the exterior surface of the thermoplastic housing means, are metallized, and wherein adjacent metallized surfaces of the cap, base and thermoplastic housing means are joined by a metal-to-metal bonding technique.

13. A packaging arrangement according to claim 1, wherein said thermoplastic housing means is formed in at least two sections, and wherein adjacent mating surfaces of said two sections are metallized and joined by a metal-to-metal bonding technique.

14. A packaging arrangement according to claim 1, wherein said means for providing access in said thermoplastic base comprise openings in said base, and wherein said conductor means is exposed through said openings.

15. A method of packaging an energy dissipating device, comprising the steps of:
    a. forming a thermoplastic housing;
    b. depositing conductor means on a surface of the thermoplastic housing;
    c. mounting the energy dissipating device in the housing;
    d. connecting a plurality of bonding pads on the device to the conductor means;
    e. forming a thermoplastic cap and thermoplastic base; and
    f. metallizing at least a portion of an exterior surface of the thermoplastic housing;
    g. metallizing at least a portion of respective interior surfaces of the thermoplastic cap and the thermoplastic base; and
    h. joining the thermoplastic housing, the thermoplastic base and the thermoplastic cap by a metal-to-metal bonding technique.

16. The method according to claim 15, comprising the additional steps of:
    i. forming at least one opening in the thermoplastic housing;
    j. metallizing at least a portion of a surface of the opening;
    k. connecting the metallized surface of the opening to the conductor means; and
    l. forming an opening in the thermoplastic base to provide access to the metallized surface of the opening in the thermoplastic housing from outside the packaging arrangement.

17. The method according to claim 16, further comprising the step of mounting a conductive pin in the opening in the thermoplastic housing.

18. The method according to claim 15, wherein substantially all of the interior surfaces of the cap and base, and substantially all of the exterior surface of the thermoplastic housing, are metallized.

* * * * *